United States Patent [19]
Bartet

[11] Patent Number: 5,828,323
[45] Date of Patent: Oct. 27, 1998

[54] HIGH SPEED KEYBOARD FOR COMPUTERS

[76] Inventor: Juan F. Bartet, Talara Ave. 432, Jesus Maria, Lima 11, Peru

[21] Appl. No.: 697,881

[22] Filed: Sep. 3, 1996

Related U.S. Application Data

[63] Continuation-in-part of Ser. No. 238,016, May 3, 1994, abandoned.

[51] Int. Cl.⁶ ................................................ H03K 17/94
[52] U.S. Cl. .............................. 341/22; 341/23; 341/26; 400/100
[58] Field of Search .................................. 341/20, 21, 22, 341/26, 23; 345/168; 364/189, 709.12, 709.15, 709.16; 400/87, 91–94, 100, 472, 473, 485, 486, 489

[56] References Cited

U.S. PATENT DOCUMENTS

| | | | |
|---|---|---|---|
| 4,467,321 | 8/1984 | Volnak | 341/23 |
| 4,655,621 | 4/1987 | Holden | 400/100 |
| 5,017,030 | 5/1991 | Crews | 400/485 |
| 5,281,966 | 1/1994 | Walsh | 341/22 |
| 5,552,782 | 9/1996 | Horn | 341/22 |

*Primary Examiner*—Jeffery Hofsass
*Assistant Examiner*—Andrew Hill
*Attorney, Agent, or Firm*—Cushman Darby & Cushman IP Group of Pillsbury Madison & Sutro LLP

[57] ABSTRACT

An ergonomic keyboard utilizing ten keys which are activated in pairs to produced coding signal representing alphabetic symbols of a conventional computer keyboard. The keyboard is operated as a replacement or in parallel with a conventional computer keyboard. Each key corresponds in position with each finger on a hand. By pressing two keys, unique letters and functions are produced. As the number of unique binary combinations of ten elements is 45, the ten-key keyboard system is capable of representing at least 26 characters plus the function keys of a standard 101-key computer keyboard. The structure enables greater speed through efficiency in finger movement and easy learning.

7 Claims, 8 Drawing Sheets

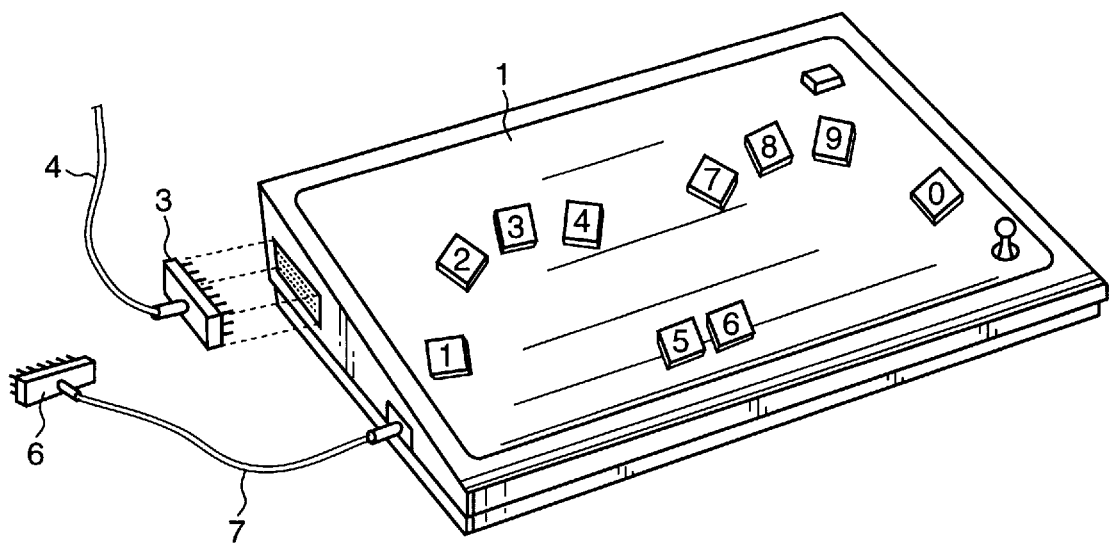

| CASE 1 | w | e | r | t | y | u | i | o | p | |
|---|---|---|---|---|---|---|---|---|---|---|
| | | s | d | f | g | h | j | k | l | |
| | | | z | x | c | v | b | n | m | |
| | | | | q | a | | | | | |

| CASE 2 | w | e | r | t | y | u | i | o | p | |
|---|---|---|---|---|---|---|---|---|---|---|
| | | s | d | f | g | h | j | k | l | |
| | | | v | b | n | m | z | x | c | |
| | | | | q | a | | | | | | ns
HIGH SPEED KEYBOARD FOR COMPUTERS

CROSS-REFERENCE TO RELATED PATENT APPLICATION

This invention is a continuation-in-part of application Ser. No. 08/238,016 filed May 3, 1994 abandoned.

FIELD OF THE INVENTION

This invention relates to a keyboard for use with computers and electronic typewriters, and more specifically, to an ergonomically designed keyboard which provides increased operating speed. Peruvian patent application no. 220136 filed May 3, 1993 is incorporated herein, by reference.

BACKGROUND OF THE INVENTION

Typewriters and computers use standard keyboards typically having 101 keys for inputting character sets including letters, symbols, numbers or functions. These keyboards require coordinated movements of the user's arms, hand and fingers which limit the speed of operation and may also tire the user. Keyboards which eliminate these problems are not known to be in wide use.

The purpose of the invention is to facilitate the input of information into the computer at higher speeds than that of a standard keyboard used generally by computers.

SUMMARY OF THE INVENTION

Generally, the invention comprises a keyboard system for providing information to a computer characterized by a keyboard platform including a number of user-activated keys aligned ergonomically, electric circuits for translating activation of paired keys on said platform into unique electrical signals representing unique symbols, functions or letters in a character set, a source of power, and means for connecting the keyboard system with a computer and/or its standard keyboard.

In a specific illustrative embodiment, a keyboard platform has ten keys ergonomically arranged and associated with ten corresponding fingers of a user and which uses an electrical circuit to convert respective pairs of keys pressed to provide forty-five combinations for each entry which correspond to the corresponding letters of the alphabet, functions, numbers, spaces and others, using a mnemonic code or unique coding scheme.

The invention may be better understood by reference to the accompanying description taken in connection with the following drawings. However, the invention is pointed out with particularity by the appended claims.

BRIEF DESCRIPTION OF DRAWINGS

FIG. 2 is an isometric projection of the inventive high speed keyboard illustrating ten keys with respective key numbers 0 to 9.

FIG. 3 is a diagram illustrating an example of a coding scheme which may be used with the present invention.

DESCRIPTION OF ILLUSTRATIVE EMBODIMENT

The present invention comprises a mechanical and electronic system including a keyboard platform, with ten keys ergonomically arranged for a user's hands and fingers wherein one key is associated with each of ten fingers.

Figure 1:
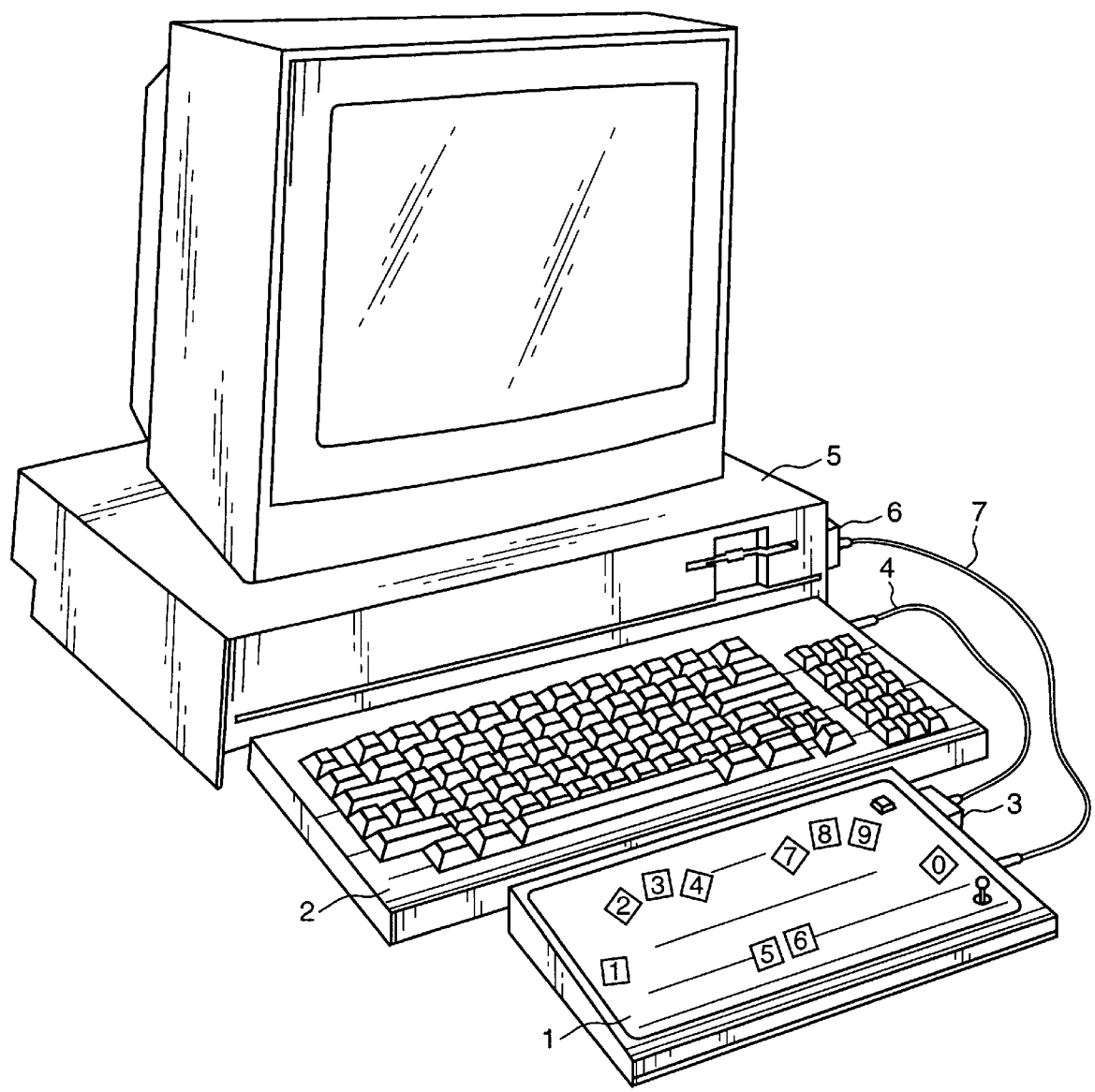
FIG. 1 is an isometric projection of the installation of the inventive high speed keyboard with the computer.

Referring to FIG. 1, a high speed keyboard 1 having ten keys marked with respective numbers from "0" to "9" is shown. The keyboard 1 is connected to computer 5 through cable 7 via an outlet 6 of the computer. The connection between the inventive keyboard and the computer and logic circuitry for producing unique electrical representations of symbols, letters and functions based on paired combinations of keys pressed is well-known in the art. On the other hand, standard keyboard 2 is connected to high speed keyboard 1 through cable 4 of the standard keyboard via outlet 3 of the high speed keyboard. A coding scheme is used by the invention to represent letters of the alphabet (or other characters, symbols or functions). That code utilizes keys "0" through "9" on high speed keyboard 1, as explained below.

The mechanism does not respond to the pressing of any one of the ten keys. However, simultaneously pressing two keys or the near simultaneous pressing of two keys, according to a chosen pair, represents the different characters, letters, symbols, numbers, or functions. Since the number of unique paired combinations of ten elements (keys) is forty-five in this arrangement, all letters of the alphabet can be represented by the ten elements, as well as the majority of functions or other characters, such as spaces, returns, etc. on the computer keyboard.

Since the keyboard used by present day computers usually includes 101 keys, the keyboard of this invention is designed as a supplement to the computer keyboard, but not to replace it.

The ten keys provide the electrical impulse to an electrical circuit which transforms the binary inputs of the ten keys into the required signals in order to derive the forty-five unique combinations; each one corresponding to one key, symbol, function or a desired number. The unit of this mechanism contains logic circuits and a power source, as well as cabling and connectors to enable connection between the computer and the standard keyboard.

Advantageously, the invention allows easier typing without looking at the keyboard, permits higher operating speeds due to reduced movement to engage a key representing a character by avoiding movement of the whole arm in order to place a finger in at the adequate coordinates (the system requires only pressing the fingers to engage a character), and is less tiring for the user because of reduced movement.

Taking into account that in order to operate the keyboard system of this invention, the user must remember all forty-five paired combinations for respective characters, a Mnemonic Typing Code has also been developed.

A coding scheme similar to the Universal Typing Code, which has been approved by the Toronto Congress, for example, may be used with the present invention. There are variations of this code which are adapted to the different languages. The present invention is described for the Spanish and/or English language, but can be equally adapted to other languages, as well.

The Universal Typing Code uses three rows of characters. The first row contains the following letters: Q, W, E, R, T, Y, U, I, 0, P. The second row contains the following keys A, S, D, F, G, H, J, K, L. The third row contains the following letters: Z, X, C, V, B, N, M.

As shown in FIG. 3, the coding scheme of the present invention is composed of nine rows. The first row includes nine letters: W, E, R, T, Y, I, 0, P. It includes the letters of the first row of the Universal Keyboard, with the exception of the letter Q. The second row of the coding scheme includes the following letters: D, F, G, H, J, K, L, N (with an optional ñ which can also be replaced with a desired function, character, symbol, etc.). The second row of the coding scheme differs from the second row of the universal code in that it omits the letters A and S at the beginning, and the fact that in the coding scheme these letters are placed in the fourth row, as discussed below. The third row contains the following letters: Z, X, C, V, B, N, M and coincides with the third row of the Universal Keyboard. The fourth row includes the following letters: Q, A, S. Thus, so far, twenty-seven combinations have been used out of forty-five possible combinations. Other combinations are optional and may be used for desired functions, letters, numbers, symbols or characters, such as shown in rows four through nine of FIG. 3.

Referring to FIGS. 2 and 3, the illustrative coding scheme of the present invention operates in the following manner: Pressing the one key (FIG. 2) in addition to one other key (2 through 10 of FIG. 2) activates a desired letter (W, E, R, T, Y, U, I, 0, P contained in the first row of FIG. 3). In other words, by pressing key positions 1 and 2 on the keyboard of FIG. 2, the letter W is obtained. By pressing in sequence the keys 1 and 3 on the keyboard of FIG. 2, the letter E is obtained, etc. Pressing the No. 2 key of the keyboard of FIG. 2 enables activation of characters on the second row of FIG. 3. Pressing key No. 3 in addition to key No. 2, e.g., "23", the letter D is obtained (the first letter of the second row).

However, if key No. 2 is pressed and key No. 1 is pressed, e.g., "12" according to the previous explanation, the letter W from the first row is obtained. It should be observed that the first key of the sequence of keys pressed in the pair determines the row in which the desired character is selected.

An exemplary model of one specific construction and operation of a system embodying the present invention is programmed with a mnemonic typing code including keys 1, 2, 3, 4, 5, 6, 7, 8, 9, 0 positioned from left to right wherein the keys from 1 to 5 correspond to fingers of the left hand and wherein the little finger corresponds to key No. 1, the ring finger corresponds to the No. 2 key, the middle finger corresponds to key No. 3, the index finger corresponds to key No. 4, and the thumb corresponds to key No. 5, and keys No. 6 to 0 oppositely correspond respectively to fingers of the right hand, such that pressing key No. 1 with one of the keys from 2 to 0 activate keys W, E, R, T, Y, U, I, O, and P in such a manner whereby pressing simultaneously said key No. 1 with key No. 2, the letter W is formed, pressing said key No. 1 with key No. 3, the letter E is formed and thus, successively until the pair of said key No. 1, with the No. 0 key to form the letter P; and pressing key No. 2 with one of the keys from 3 to 0 activates letters D, F, G, H, J, K, L and N such that pressing simultaneously said key No. 2 with key No. 3, D is obtained; pressing said key No. 2 with key No. 4, F is formed; and thus successively until the pair of said key No. 2 with key No. 0 form letter N; pressing key No. 3, with one of the keys from 4 to 0 activates keys Z, X, C, V, B, N and M whereby pressing simultaneously said key No. 3 with key No. 4 the letter Z is formed, pressing said key No. 3 with key No. 5, the letter X is formed, and thus successively until the pair of said key No. 3 with Key No. 0 in order to form letter M; pressing simultaneously key No. 4 with key No. 5 the letter Q is formed, pressing said key No. 4 with Key No. 6 the letter A is formed, pressing said key No. 4 with key No. 7 the letter S is formed, pressing said key No. 4 with key No. 8 the period (.) is formed, pressing said key No. 4 with key No. 9 the colon is formed (:), pressing said key No. 4 with key No. 0 the semi-colon (;) is formed, pressing key No. 5 with key No. 6 the space is formed, pressing said key No. 5 with key No. 7 the return is obtained, pressing said key no. 5 with key No. 9 the function is formed (!), and pressing said key No. 5 with key No. 0 the dash (–) is obtained; pressing key No. 6 with key No. 7 the opening question mark is formed (?), pressing said key No. 6 with key No. 8 the closing question mark is formed (?), pressing said key No. 6 with key No. 9 the opening exclamation mark is formed ( ), pressing said key No. 6 with key No. 0 the closing exclamation mark is formed (!); pressing key No. 7 with key No. 8 capital letters are formed; pressing said key No. 7 with key No. 9 capital letters are removed, and pressing said key No. 7 with key No. 0 forms the open parenthesis symbol ((); pressing key No. 8 with key No. 9 the coma (,) symbol is formed; and pressing said key No. 9 with key No.0 the closing parenthesis symbol is formed ()); and finally, pressing key No. 9 with key No. 0 a quotation mark is formed (").

The coding scheme may be arranged differently or with fewer or greater than ten keys. Codes other than the Universal Typing Code may be implemented. Using ten keys arranged as described, any forty-five of a given character set of a given language may be implemented. A fewer or greater number of keys may be arranged to represent lesser or a greater number of characters in a given language. The mnemonic coding diagram may be altered so as to alter the position-to-character relationship, rather than as shown in FIG. 3, for example. A mnemonic coding diagram may also be integrated or combined with a keyboard unit so as to facilitate teaching of the specific coding scheme utilized with a given coding scheme.

Figure 4:
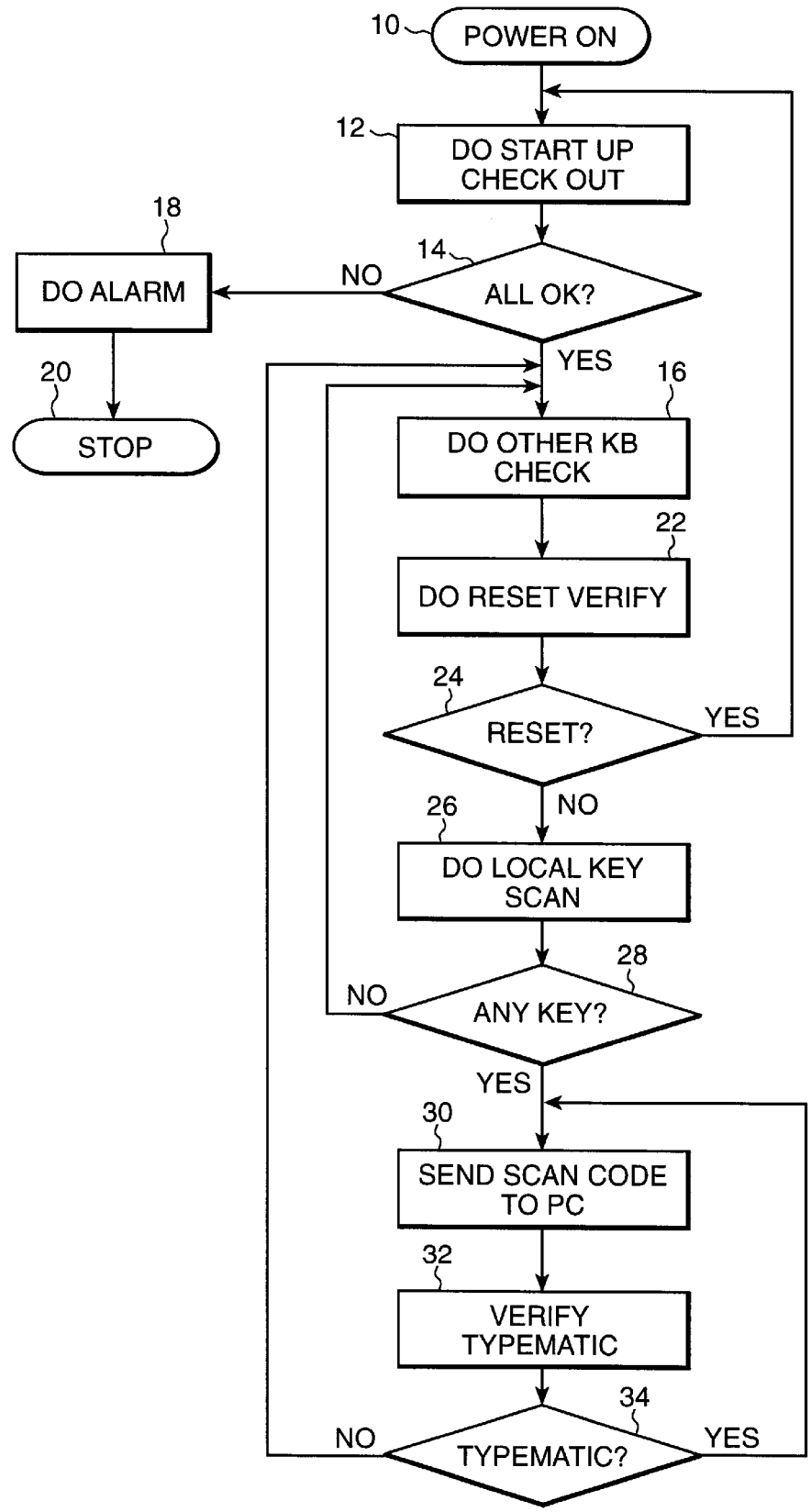
FIG. 4 is a flow chart illustrating operations of a microcontroller of the present invention.

FIG. 4 is a flow chart illustrating the operations of a microcontroller of the present invention. The microcontroller receives keyboard inputs, handles communications with the keyboard port on the PC motherboard and controls by multiplexing data and clock signals from a normal PC keyboard that communicates with the computer under control of the 10-key keyboard of the present invention. The microcontroller also handles housekeeping details such as power on tests, alarm handling and system checks.

FIG. 4 illustrates that after power up, step 10, the microcontroller initiates a start up sequence step 12 which confirms proper operation of the system, as indicated above. If start up check out performs successfully, the system branches in step 14 to perform other keyboard checks, step 16. Otherwise, the system branches to an alarm state, step 18 and halts, step 20, the system thereafter. Assuming successful startup, the microcontroller performs a reset verify operation.

If no reset command is detected, the system branches in step 24 to a keyboard scanning operation in step 26 for detecting the depression of keys on the 10-key high speed keyboard. If no key depressions are detected the microcontroller branches in step 28 to maintain detection of key depression by looping back to keyboard checking algorithms in step 16. This loops is maintained until a key depression is detected.

If one of the keys on the 10-key keyboard is depressed, the microcontroller branches in step 28 to another state in step 30 which sends a scan code to the PC. The scan code is representative of the key depressed. A typematic detection algorithm at step 32 detects continued depression of a key for effecting repeated transmissions of the code representing the depressed key to the PC in a loop between operations in step 30, 32 and 34. If no continued depression, e.g., repeat key, is detected, the microcontroller returns to step 16 to ready itself for detection of another key depression.

Figure 5:
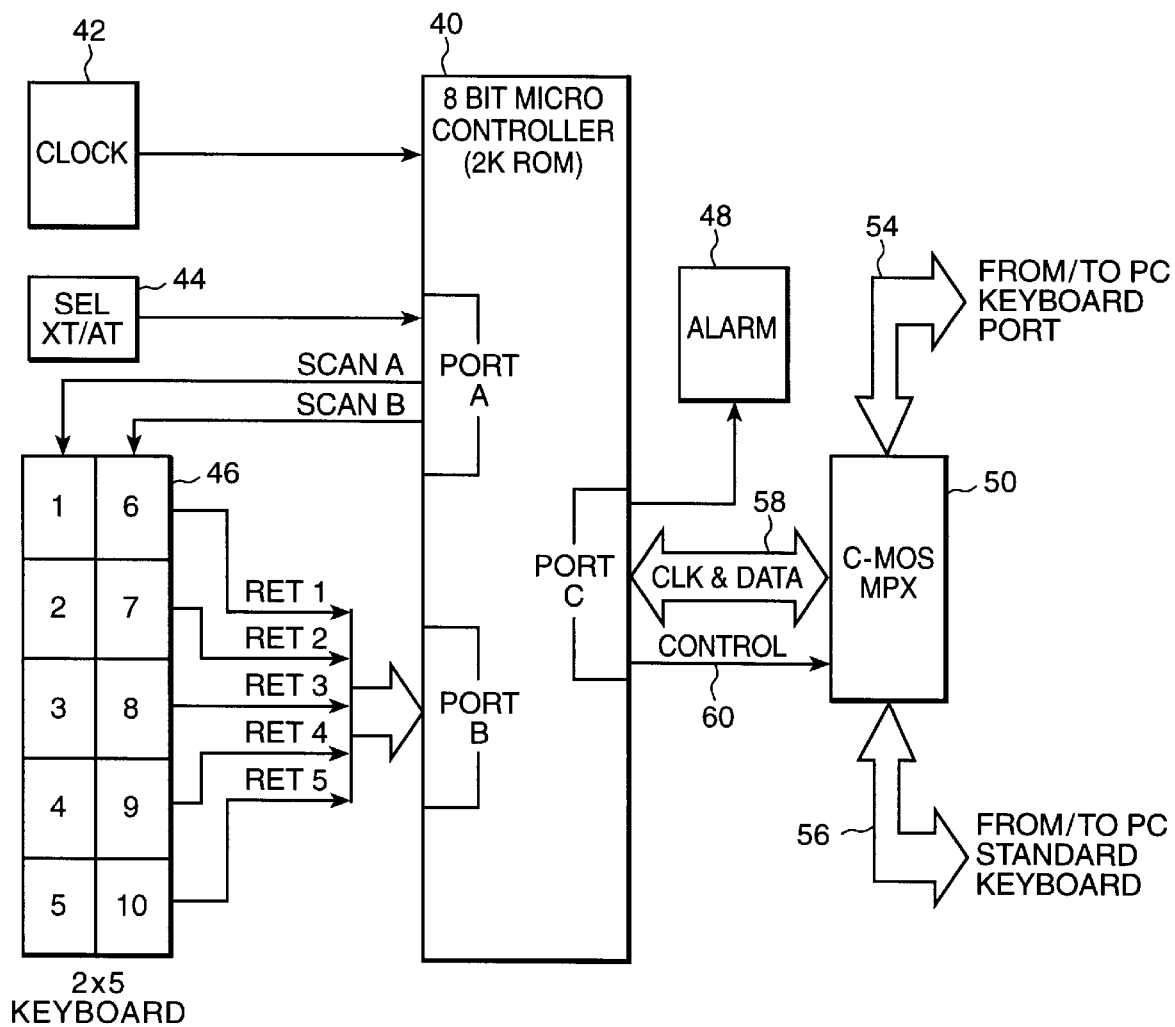
FIG. 5 depicts a system block diagram of various components of the inventive keyboard and controller system.

As depicted in FIG. 5, the system includes 8-bit Intel 8751 microcontroller 40, clock generator 42, PC type status indicator 44, 10-key keyboard matrix 46, alarm 48, and CMOS multiplexer 50. The clock signal generator 42 drives the operations of microcontroller 40 while the PC status indicator 44 connects port A of the microcontroller to render the controller 40 compatible with PC XT and PC AT machines. Alarm 48 emits an audible alarm or typographic message indicating any error detected during the alarm routine in step 18 (FIG. 4).

Still referring to FIG. 5, keyboard switching matrix 46 includes ten contact switches numbered one through ten that are activated by respective key pads zero through nine of FIG. 2. Switch contacts of two columns of switching matrix 46 connect with two inputs at port A of controller 40 (SCAN A and SCAN B inputs), and switch contacts of five rows of the matrix 46 connect with five inputs of the controller (RET 1, RET 2, RET 3, RET 4 and RET 5). Controller 40 senses the on-off status of switch matrix inputs at ports A and B to determine which key is depressed.

Controller 40 generates PC compatible scan codes in accordance with the Querty codes defined by the present invention, and further includes sense timers for filtering false key contacts, such as by sensing the duration and time-spacing of key depressions. Controller 40 also registers a "first key pressed" and monitors a "second key pressed" before clearing the first key pressed from the register, and cancels a current operation if the "first key" is released before depression of a "second key."

The physical connection with the PC is made via the CMOS multiplexer 50. A connector cable 54 connects to a standard five-pin DIN keyboard connector that carries clock and data lines, as well as, ground (common), +5 Vdc supply and reset signals. The +5 Vdc line powers both the standard character keyboard and the high-speed 10-key inventive keyboard. Intercommunication between the keyboard and the PC is achieved via standard asynchronous data communication protocols used by convention PC XT and PC AT machines. Two signals on respective lines of bus 58 from parallel port C carry clock and serial data signals to CMOS multiplexer 50 which are generated in a conventional manner by software in the microcontroller. A "warm reset" or "soft boot" is done by closing the clock signal.

The standard keyboard of the computer and the high-speed 10-key keyboard operate together, as indicated by coupling of bus 56 of multiplexer 50 to the standard keyboard and the coupling of both keyboards to the PC via bus 54. Because both keyboards are connected to the PC, multiplexer 50 is under the control of microcontroller 40 to prevent both keyboards from simultaneously passing signals to the PC. To achieve this task, microcontroller 40 detects key depressions on the high-speed 10-key keyboard and disconnects the standard 101-key keyboard in response to such detection. With any scan code representative of a depression on keypad 46, the standard keyboard is electrically disconnected from its port via a control signal conveyed over line 60 and the connection of keypad 46 to port B is maintained. The connection of keypad 46 is maintained as long as scan codes are ready to be sent and/or for a period of time (e.g., a second) after the last scan code has been sent. Thereafter, the standard keyboard is reconnected.

Figure 6:
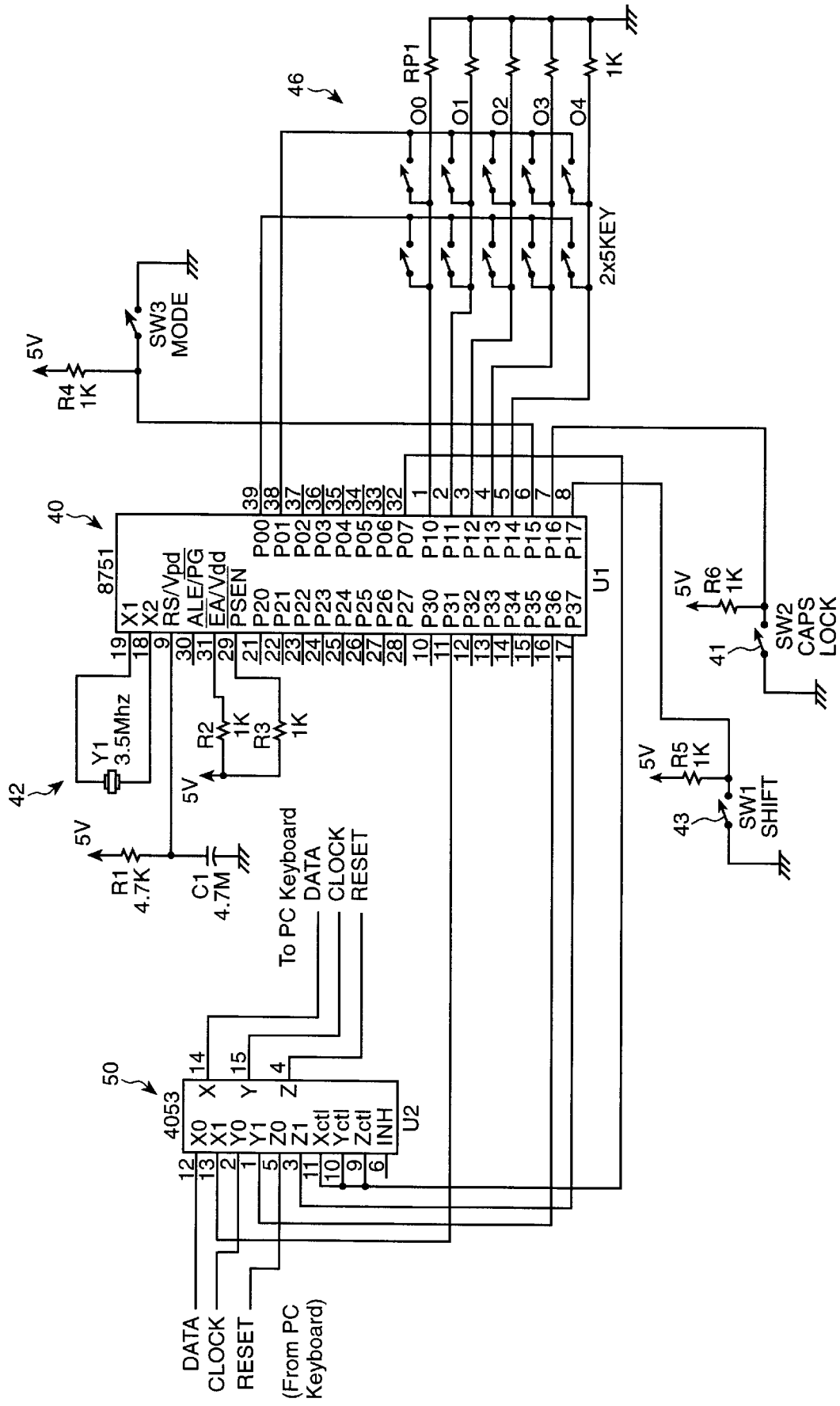
FIG. 6 is a detailed circuit diagram of the inventive keyboard controller of the present invention.

FIG. 6 is a detailed circuit diagram of the controller 40, keypad 46, clock generator 42 and multiplexer 50 of FIG. 5. In a preferred embodiment, the keyboard switching matrix is an array of two rows of five switches each. The columns, referred to as SCAN 0 and SCAN 1, are connected to ports P00 and P01 (pins 39 and 38, respectively) of an Intel 8751 microcontroller which outputs a signal sequentially as described in Intel product specification sheets MCS-51 published by Intel Corporation. Five rows or lines designated 00 through 04 of switch 46 each of which cross-connect with the two aforementioned columns connect to pins 1 through 5 of the Intel 8751 microcontroller 40. A one-ohm pull-down resistor couples each line 00 through 04 to ground (common) to force the input to low level when the switches of matrix 46 are open.

In the preferred embodiment, the 8751 microcontroller 40 generates all voltages and signal levels required for the switching matrix 46. No other circuitry or logic devices are involved in the keyboard matrix except the ten switches, the five pull-down resistors and ports 00 and 01 of the 8751 controller. A crystal oscillator provides a clock signal for clock generator 42 at pin 18 and 19 of controller 40.

The CMOS multiplexer 50 is based on Intel's 4053 integrated circuit which is also described in publicly available literature and specification sheets published by Intel Corporation. The multiplexer circuit is configured to form a triple two-to-one multiplexer by connecting three control inputs whereby a single control line effects the flow of three signals entering the two-to-one multiplexer. As indicated, pins 4, 15 and 14 of multiplexer 50 respectively transmit reset, clock an data signals to the PC, whereas pins 5, 2 and 12 of multiplexer 50 respectively receive reset, clock and data signals from the standard PC keyboard.

Figure 7:
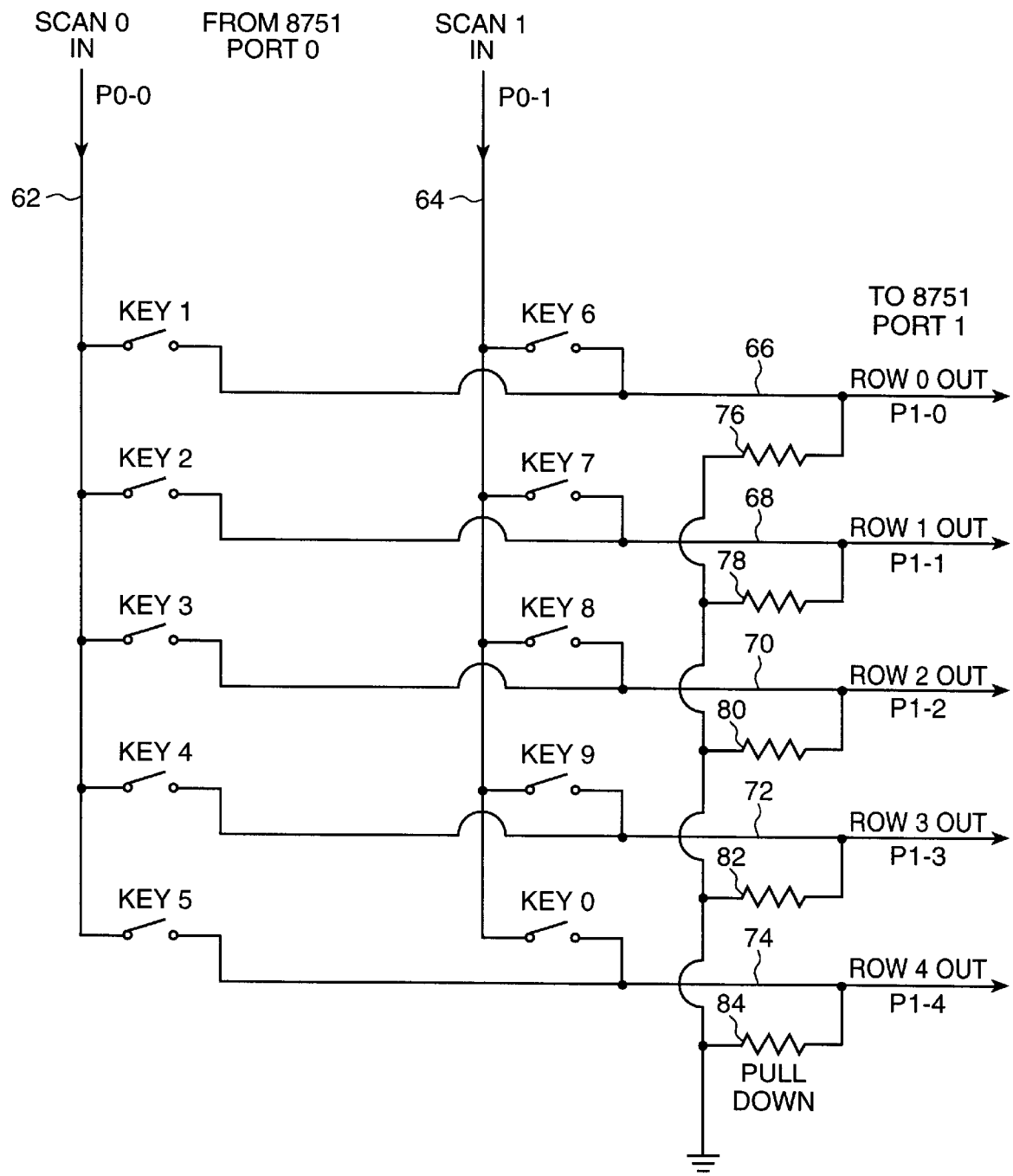
FIG. 7 is a circuit diagram of the key switch matrix of the present invention.

FIG. 7 illustrates further details of the 10-key keyboard switching matrix 46. SCAN 0 and SCAN 1 couple inputs from the 8751 controller 40 serve as common supply lines to respective columns of key switches, KEY 1 through KEY 5 in a first column and KEY 6 through KEY 0 in a second column. Output lines 66–74 of rows zero through four connect to pins one through five of controller 40 (FIG. 6). Pull-down resistors 76–84 hold the voltage levels of lines 66–74 to ground when keys zero through nine are open. Pull-down resistors have values of approximately one-ohm each.

Figures 8, 9A, 9B:
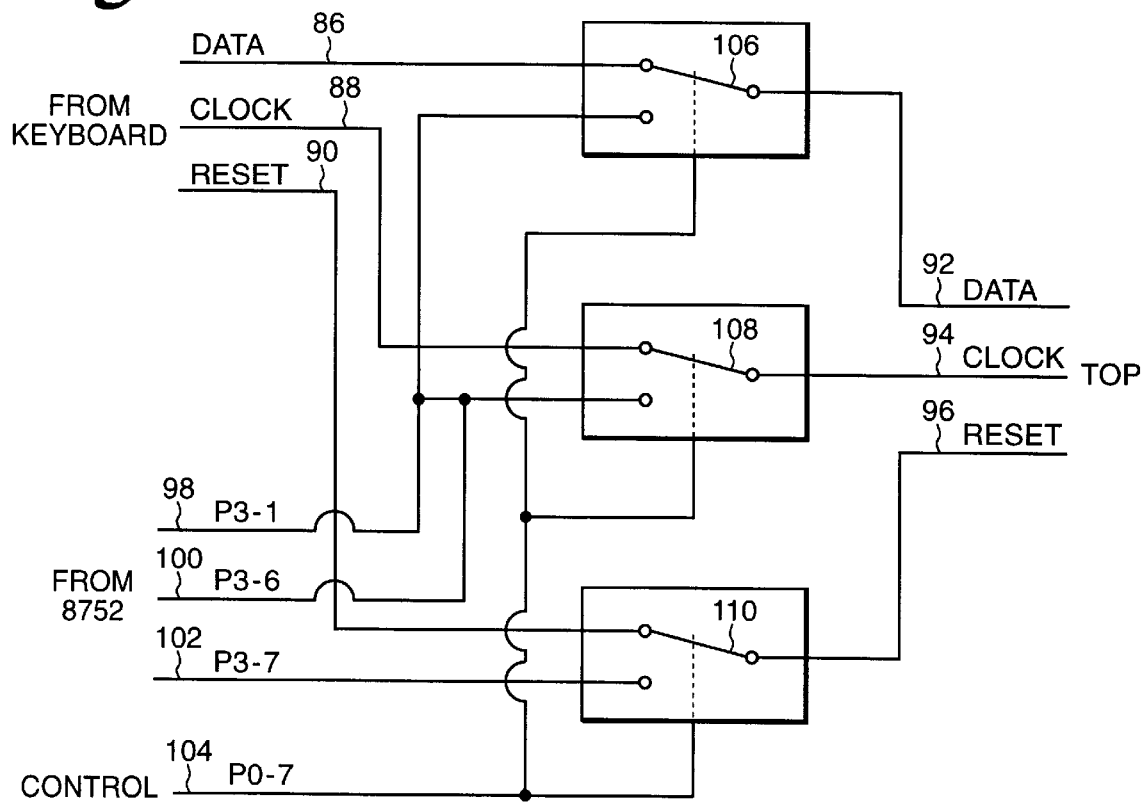
FIG. 8 is a functional circuit diagram of a CMOS multiplexer which enables switching between the 101-key standard keyboard and the inventive 10-key keyboard of the present invention.
FIGS. 9(a) and 9(b) depict alternative positional relationships of characters and depressed key-pairs.

FIG. 8 is a detailed circuit diagram of the CMOS multiplexer 50 (FIG. 6). Data, clock and reset signal from the PC keyboard enter the multiplexer 50 via lines 86, 88 and 90 and these signals are supplied to the PC via output lines 92, 94 and 96 that connect to the 5-pin DIN input of the PC motherboard. Coded data and clock signal from the high-speed 10-key keyboard are also supplied over input lines 98, 100 and 102 to multiplexer 50 from the Intel 8751 microcontroller 40 and ultimately to the PC keyboard input via output lines 92, 94 and 94. A control signal generated by the 8751 controller 40 on line 104 effects multiplexing of multiplexer switches 106, 108 and 110 so that, in a first state, the standard keyboard signals are supplied to the PC, and in a second state, the high-speed keyboard signals are supplied to the PC. Logical zero effects connection of the standard keyboard to the PC while logical one effects connection of the high-speed keyboard, e.g., port three, pins 1, 6 and 7 of the 8751 controller.

The microcontroller 40 is a member of the Intel MCA-51 family of microprocessors readily available and described in Chapters seven through eleven of the Intel Micro Controller Handbook.

FIGS. 9(*a*) and 9(*b*) depict alternative coding schemes that may be implemented by the present invention. The respective layouts or definitions are adapted to the individual characteristics of users who look at a keyboard when they type and those who do not. Each character position is uniquely assigned one of the possible forty-five unique representations attainable by depressed key pairs. FIG. 9(*a*), for example, shows a numeric relationship or definitional layout in rows and columns for translating pairs of depressed keys with alphabetic characters when a user is looking at a keyboard layout. FIG. (9*b*) shows a similar relationship when a user is not looking at the keyboard. As seen, the first three rows of each layout in FIGS. 9(*a*) and 9(*b*) represent a standard Querty code of a typical 101-key keyboard.

To implement each of the keyboard layouts, the present invention provides a two-state switch that inputs a status bit to an available input of microcontroller 40 (FIG. 6). This status is recognized in a conventional manner during the process of conversion of key switch pairs to characters. In a first state, the 10-key keyboard operates in accordance with the translation of FIG. 9(*a*), and in a second position or state, the 10-key keyboard operates in accordance with the layout of FIG. 9(*b*).

In addition, a second manual switch may be provided, as shown by switches 41 and 43 (FIG. 6) to instruct the controller 40 to interpret key-pairs as capital letters of the alphabet. In one instance, switch 41 locks all inputs to capital letters and in another instance, switch 43 acts simply as a "shift" key.

Figure 10:
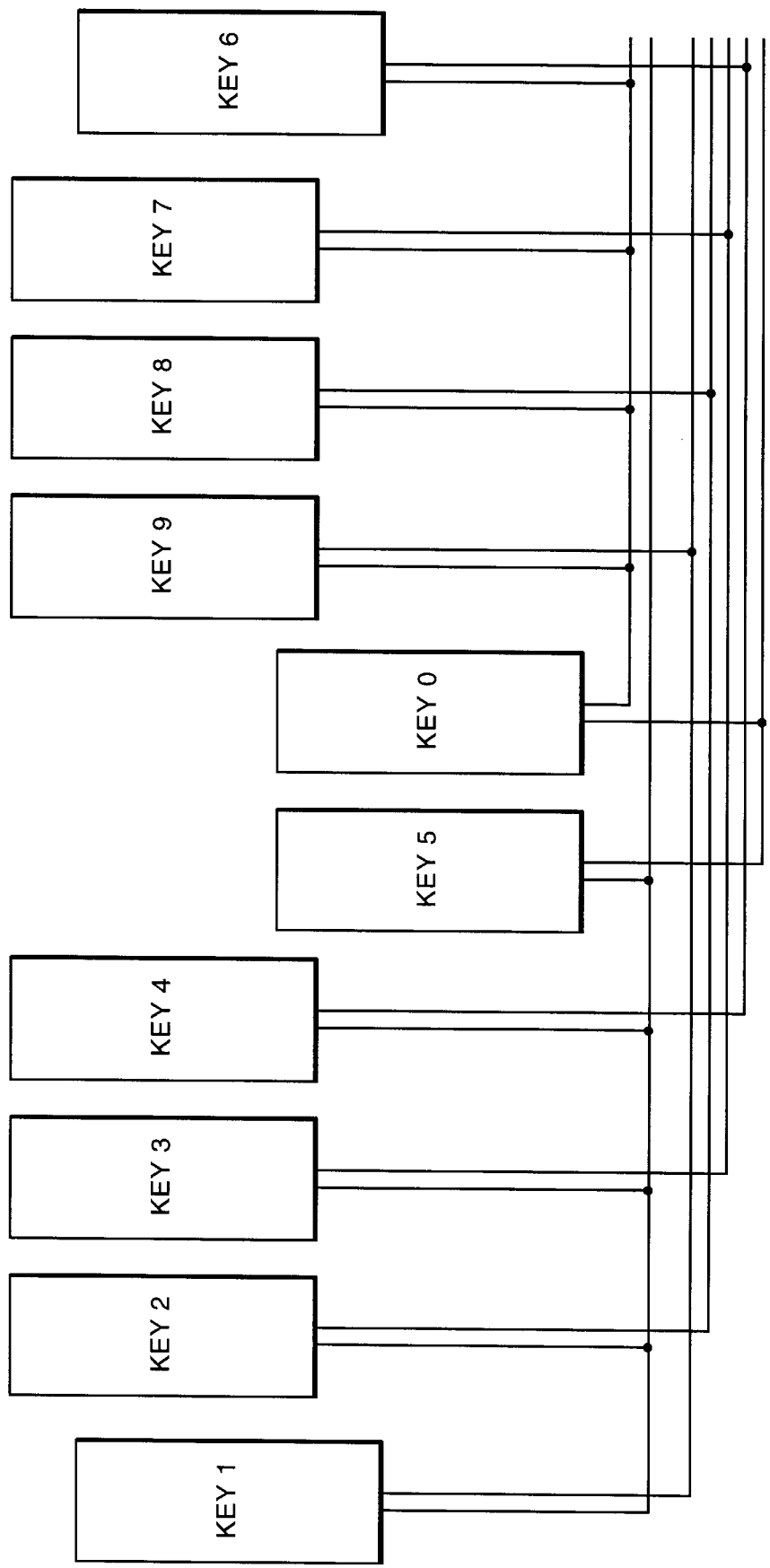
FIG. 10 illustrates a piano-like shaped key structure of the 10-key keyboard of the present invention.

FIG. 10 depicts a representation of a novel keyboard layout of the present invention. As seen, a "piano-type" shaped key switch structure is utilized which advantageously dispenses the mechanical means for adapting to human finger tip topology. The piano keys readily enables use with small, large, narrow and wide hands. Keys 0 through 9 correspond to keys 0 through 9 of FIG. 7 and simple close contacts when depressed. Keys 0 through 9 may be assigned to any row or column which best matches the code being implemented.

For purposes of illustration, I have described an illustrative embodiment. As known to those skilled in the art to which this subject matter pertains, there may be variations and modifications made to the invention without departure from the spirit and scope of the invention. Thus, I do not limit my invention to any specific embodiment shown or described, but instead, embrace those other modification, adaptations and improvements which may come to those skilled in the art.

What I claim is:

1. An auxiliary keyboard system for providing information to a computer, characterized by a keyboard unit including ten ergonomical piano-like shaped keys, one for each finger, circuit means for translating activation of paired keys into unique electrical signals, and a source of power to supply the auxiliary keyboard system.

2. A keyboard system as recited in claim 1 wherein the keys of the keyboard system are elongated to readily adapt to hands of different sizes.

3. A keyboard system as recited in claim 2 characterized by being programmed to implement a typing code wherein said keyboard system includes keys 1, 2, 3, 4, 5, 6, 7, 8, 9, 0 positioned from left to right and wherein the keys 1 to 5 correspond to fingers of the left hand such that the little finger corresponds to key No. 1, the ring finger corresponds to the No. 2 key, the middle finger corresponds to key No. 3, the index finger corresponds to key No. 4, and the thumb corresponds to key No. 5, and wherein keys 6 to 0 oppositely correspond respectively to fingers of the right hand, such that pressing key 1 together with one of keys 2 to 0 activates one of characters W, E, R, T, Y, U, I, O, and P in such a way where pressing simultaneously said key 1 with said key 2, the letter W is formed; pressing said key 1 with said key 3, the letter E is formed and thus, successively until the pair of said key 1 with said keys through key 0 to form the last letter P in a first sequence of letters; and pressing key 2 with one of the keys from 3 to 0 generates letters D, F, G, H, J, K, L, and N such that pressing key 2 with said key 3, D is generated, pressing said key 2 with said key 4, F is generated; and thus successively until the pair of key 2 with said keys through key 0 form the last letter N in a second sequence of letters; pressing said key 3 with one of the keys from 4 to 0 generates keys Z, X, C, V, B, N and M whereby pressing said key 3 with said key 4, the letter Z is generated, pressing said key 3 with said key 5, the letter X is generated, and thus successively until the pair of said key 3 with said keys through key 0 in order to form the last letter M in a third sequence; pressing simultaneously said key 4 with said key 5 the letter Q is generated, pressing said key 4 with said key 6 the letter A is generated, pressing said key 4 with said key 7 the letter S is generated, pressing said key 4 with said key 8 a period is generated, pressing said key 4 with said key 9 a colon is generated, pressing said key 4 with said 0 a semi-colon is generated, pressing said key 5 with said key 6 a space is generated, pressing said key 5 with said key 7 a return is generated, pressing said key 5 with said key 9 a function is generated, and pressing said key 5 with said key 0 a dash is generated, pressing said key 6 with said key 7 an opening question mark is generated, pressing said key 6 with said key 8 a closing question mark is generated, pressing said key 6 with said key 9 an opening exclamation mark is generated, pressing said key 6 with said key 0 a closing exclamation mark is generated; pressing said key 7 with said key 8 capital letters are generated; pressing said key 7 with said key 9 capital letters are removed, and pressing said key 7 with said key 0 forms the open parenthesis symbol; pressing said key 8 with said key 9 a comma symbol is generated; and pressing said key 8 with said key 0 a closing parenthesis symbol is generated; and pressing said key 9 with said key 0 a quotation mark is generated.

4. A keyboard system as recited in claim 1 characterized by being programmed to implement a mnemonic typing code wherein said keyboard system includes keys 1, 2, 3, 4, 5, 6, 7, 8, 9, 0 positioned from left to right and wherein the keys 1 to 5 correspond to fingers of the left hand such that the little finger corresponds to key No. 1, the ring finger corresponds to the No. 2 key, the middle finger corresponds to key No. 3, the index finger corresponds to key No. 4, and the thumb corresponds to key No. 5, and wherein keys 6 to 0 oppositely correspond respectively to fingers of the right hand, such that pressing key 1 together with one of keys 2 to 0 activates one of characters W, E, R, T, Y, U, I, O, and P in such a way where pressing simultaneously said key 1 with said key 2, the letter W is formed; pressing said key 1 with said key 3, the letter E is formed and thus, successively until the pair of said key 1 with said keys through key 0 to form the last letter P in a first sequence of letters; and pressing key 2 with one of the keys from 3 to 0 generates letters D, F, G, H, J, K, L, and N such that pressing key 2 with said key 3, D is generated, pressing said key 2 with said key 4, F is generated; and thus successively until the pair of key 2 with said keys through key 0 form the last letter N in a second sequence of letters; pressing said key 3 with one of the keys from 4 to 0 generates keys Z, X, C, V, B, N and M whereby pressing said key 3 with said key 4, the letter Z is generated, pressing said key 3 with said key 5, the letter X is generated, and thus successively until the pair of said key 3 with said keys through key 0 in order to form the last letter M in a third sequence; pressing simultaneously said key 4 with said key 5 the letter Q is generated, pressing said key 4 with said key 6 the letter A is generated, pressing said key 4 with said key 7 the letter S is generated, pressing said key 4 with said key 8 a period is generated, pressing said key 4 with said key 9 a colon is generated, pressing said key 4 with said 0 a semi-colon is generated, pressing said key 5 with said key 6 a space is generated, pressing said key 5 with said key 7 a return is generated, pressing said key 5 with said key 9 a function is generated, and pressing said key 5 with said key 0 a dash is generated, pressing said key 6 with said key 7 an opening question mark is generated, pressing said key 6 with said key 8 a closing question mark is generated, pressing said key 6 with said key 9 an opening exclamation mark is generated, pressing said key 6 with said key 0 a closing exclamation mark is generated; pressing said key 7 with said key 8 capital letters are generated; pressing said key 7 with said key 9 capital letters are removed, and pressing said key 7 with said key 0 forms the open parenthesis symbol; pressing said key 8 with said key 9 a comma symbol is generated; and pressing said key 8 with said key 0 a closing parenthesis symbol is generated; and pressing said key 9 with said key 0 a quotation mark is generated.

5. A keyboard system as recited in claim 1 adapted to be installed in parallel with a standard keyboard of the computer and to permit individual use of said auxiliary keyboard system and said standard keyboard.

6. A keyboard systems as recited in claim 1 including a switch operable with said keyboard for effecting alternative translations between key-pairs and alphabetic characters.

7. A keyboard system as recited in claim 1 having a mnemonic code diagram located in the upper part of a casing thereof in order to facilitate the learning and use of said keyboard system.

* * * * *